(12) United States Patent
Jevtic et al.

(10) Patent No.: US 7,345,485 B2
(45) Date of Patent: Mar. 18, 2008

(54) OPTICAL INTERFACE FOR LOCAL MRI COILS

(75) Inventors: Jovan Jevtic, West Allis, WI (US); Nunez Tatum, Milwaukee, WI (US)

(73) Assignee: Koninklijke Philips Electronics N.V., Eindhoven (NL)

( * ) Notice: Subject to any disclaimer, the term of this patent is extended or adjusted under 35 U.S.C. 154(b) by 11 days.

(21) Appl. No.: 11/334,264

(22) Filed: Jan. 18, 2006

(65) Prior Publication Data

US 2007/0164746 A1 Jul. 19, 2007

(51) Int. Cl.
*G01V 3/00* (2006.01)
(52) U.S. Cl. ..................... 324/322; 324/318
(58) Field of Classification Search ............... 324/322
See application file for complete search history.

(56) References Cited

U.S. PATENT DOCUMENTS

| | | | |
|---|---|---|---|
| 4,853,772 A | 8/1989 | Kikuchi | |
| 4,922,257 A * | 5/1990 | Saito et al. | 342/377 |
| 5,739,936 A | 4/1998 | Yakymyshyn et al. | |
| 5,882,305 A | 3/1999 | Dumoulin et al. | |
| 6,925,322 B2 * | 8/2005 | Helfer et al. | 600/423 |
| 6,980,848 B2 * | 12/2005 | Helfer et al. | 600/423 |
| 2004/0019273 A1 | 1/2004 | Helfer et al. | |
| 2004/0116801 A1* | 6/2004 | Konings et al. | 600/411 |

OTHER PUBLICATIONS

G. P. Koste, M. C. Nielsen, T. R. Tolliver, R. L. Frey, R. D. Watkins, "Optical MR Receive Coil Array Interconnect," ISMRM 2005.
PCT ISA/US, U.S. Commissioner for Patents, International Search Report, Oct. 23, 2007.

* cited by examiner

*Primary Examiner*—Brij Shrivastav
*Assistant Examiner*—Megann E Vaughn

(57) ABSTRACT

An implementation of an optical transmission path for NMR signals from local coils in magnetic resonance imaging employs a photomodulator that may be incorporated into a connecting optical cable to be shared among multiple local coils and to provide for connection and disconnection at an electrical interface eliminating the need for optical connectors.

23 Claims, 2 Drawing Sheets

OPTICAL INTERFACE FOR LOCAL MRI COILS

STATEMENT REGARDING FEDERALLY SPONSORED RESEARCH OR DEVELOPMENT

Not applicable

CROSS-REFERENCE TO RELATED APPLICATIONS

Not applicable

BACKGROUND OF THE INVENTION

The present invention relates to magnetic resonance imaging (MRI) and in particular to an interface for connecting local coils used in MRI imaging to an MRI machine.

Magnetic resonance imaging can provide sophisticated images of the human body by detecting faint nuclear magnetic resonance ("NMR") signals, primarily from concentrations of hydrogen protons in the tissues of the body. In MRI, a patient is located in a strong, polarizing, magnetic field and hydrogen protons of the patient's tissues are excited into precession with a radio frequency ("RF") pulse. A series of applied gradient magnetic fields are switched on and off to spatially encode the precessing protons by phase and frequency. A sensitive antenna is then used to detect the NMR signals which are reconstructed into images.

MRI machines normally provide an integral antenna as part of the magnet assembly that may be used both for the RF excitation pulse and for detecting the NMR signal. Preferably, however, the NMR signals will be detected using one or more "local coils" being one or more small antennas that may be positioned near the patient to provide for improved signal-to-noise ratio in the detection of the NMR signals.

Typically, a shielded cable is attached to the local coil to receive a signal from preamplifiers built into the local coil that amplify the signal before transmitting it to the MRI machine. The shielded cable may connect to a termination box on the MRI machine (a "dog house") often at the end of the patient table, where signals from the shielded conductor are routed to the MRI processing electronics. The termination box may also provide a source of electrical power, transmitted through the shielded cable to the local coil, to power the preamplifiers. In addition, the shielded cable may conduct other electrical signals to the local coil including active decoupling signals communicating with decoupling circuits in the local coil to detune the local coil during the RF excitation pulse to prevent excessive current conduction in the local coil during that time period. The termination box may also provide a separate electrical connector for a second shielded cable passing to the local coil and conducting an RF excitation pulse to the local coil when the local coil operates both in a receive and transmit mode.

The area around the operating MRI machine represents a difficult electrical environment for connecting a local coil to the MRI acquisition circuitry, principally with respect to establishing a good radio frequency ground. The switched fields used during the imaging process can promote high shield currents on the shield that may cause heating and possible risk to the patient. Baluns, such as those described in U.S. Pat. No. 6,605,775 entitled: "Floating Radio Frequency Trap For Shield Currents" and hereby incorporated by reference and assigned to the assignee of the present invention, provide one method of reducing these shield currents.

The shielded cables passing from the local coils to the termination box are relatively bulky and inflexible, in part, as a result of the necessary physical separation required between the patient and currents in the shield (normally enforced by a thick insulator), and the inherent stiffness of the cable conductors. This later problem is exacerbated for multi-channel coils which employ separate conductors for each channel. The inflexibility and bulk of these shielded cables can cause storage problems when multiple coils must be stored on-site, for example, in the limited space of the MRI room.

One promising solution to the problems of shield currents and electrical interference is that of transmitting the NMR signals optically, for example, over optical fibers. However, this approach faces a number of practical problems. The first is the high cost of optical modulation circuitry suitable to provide high signal-to-noise transmission of the NMR signal, a cost that is multiplied by the number of channels of the local coil.

Optical connectors allowing connecting and disconnecting of the optical fiber system from the MRI machine are currently inadequate for use in the MRI environment and introduce unacceptable signal noise resulting from the extreme sensitivity of fiber connections to vibration induced changes in alignment.

Electrical power is still required by the optical modulator and/or preamplifier in the local coil, and cabling for this purpose offsets some of the benefit of increased flexibility of the fiber, as well as making any connector more complex, now having to handle optical and electrical signals.

One final problem with optical transmission of NMR signals from local coils is the large installed base of conventional local coils and MRI machines that are not "optically enabled", accepting only electrical rather than optical signals. Such systems present an obstacle to large-scale adoption of an optical transmission system which initially would be suitable for only a small market of machines.

BRIEF SUMMARY OF THE INVENTION

The present inventors have recognized that the above obstacles to optical transmission of NMR signals can be moderated by a detachable optical cable system integrated with an optical modulator (and possibly a demodulator) so that connections between the optical cable and local coil may be made using a conventional electrical connector. In this way, the cost of the modulation circuitry can be shared among a number of coils, optical connectors are eliminated, and if the electrical connector is correctly chosen, the optical cable can be used for both new and legacy coils.

Specifically then, the present invention provides a local coil system having a support structure that may be positioned on or near the patient and at least one resonant electrical antenna attached to that support structure for receiving NMR electrical signals from the patient. A first electrical connector is attached to the support structure and receives the NMR signals to connect to a second electrical connector. The second electrical connector includes a photomodulator converting the NMR electrical signals to optical signals which are provided to an optical cable. A photodemodulator attaches to a second end of the optical cable to receive the optical signals and convert them back into NMR electrical signals for communication to an MRI machine.

It is thus one object of at least one embodiment of the invention to provide a practical method of implementing optical transmission of NMR signals from local coils by placing the photomodulator on the cable to be shared among multiple coils as connected with a standard electrical connector.

The optical cable may be unbroken by connectors between the first and second end.

It is yet another object of at least one embodiment of the invention to overcome the problem of decreased signal-to-noise ratio caused by current optical connectors. By integrating the modulator with the cable, electrical connectors can be used to disconnect the cable from the local coil and MRI machine, reducing or avoiding the need for optical connectors.

A third electrical connector may be used to allow the photo demodulator to communicate the NMR electrical signals to the MRI machine and the first and third connectors may have substantially identical electrical and mechanical configurations.

It is thus another object of at least one embodiment of the invention to provide a migration path to optically enabled local coils by providing a cable system that may work with conventional MRI machines and with legacy local coils.

The photomodulator may be an electrically driven light source or an electrically driven light gate.

Thus it is another object of at least one embodiment of the invention to provide a system that may flexibly work with different modulation types, for example, a laser diode or a Mach-Zehnder modulator.

The optical cable may be free from metallic electrical conductors. To this end, the system may include a light source attached to the second end of the optical cable providing an optical power signal, and the second electrical connector may further include a photocell receiving the optical power signal from the optical cable. The photocell may provide power to the photomodulator or preamplifiers associated with the coil or may provide a signal to electrically decouple the coil.

Thus it is another object of at least one embodiment of the invention to wholly eliminate electrical shields that reduce flexibility of the cable, and to thereby wholly eliminate shield currents such as increase electrical interference and produce undesirable heating of the patient.

In one embodiment, the optical cable may include metallic electrical conductors for passing power along the cable.

It is thus another object of at least one embodiment of the invention to provide for a low cost version of the optical transmission cable that does not require optical transmission of substantial power but which may use standard techniques to block shield currents on DC conductors.

These particular objects and advantages may apply to only some embodiments falling within the claims and thus do not define the scope of the invention.

DETAILED DESCRIPTION OF THE PREFERRED EMBODIMENT

Figure 1:
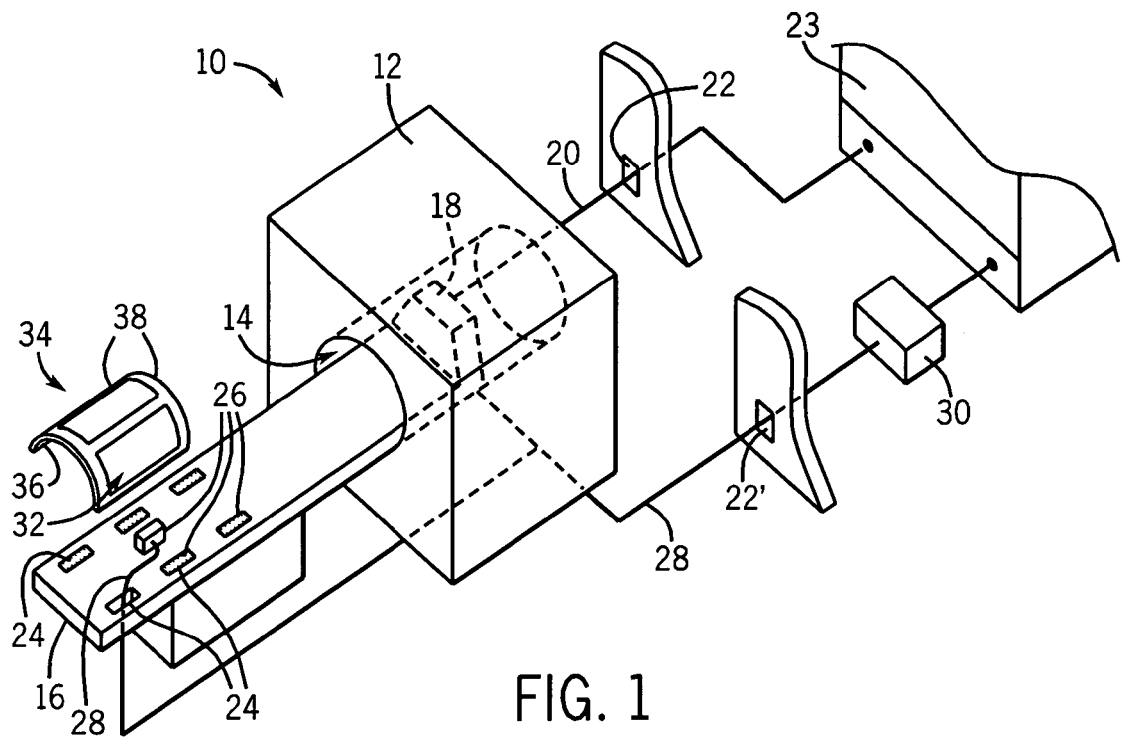
FIG. 1 is a simplified perspective diagram of an MRI machine having a magnet assembly and providing a patient table working with the magnet assembly and having contained optical cables that may connect a local coil either directly to the processing electronics of the MRI machine in a shield room or through the conventional electrical cabling of the table's termination box.

Referring now to FIG. 1, an MRI machine 10 may include a magnet assembly 12 providing a homogenous polarizing magnetic field within a bore 14 of the magnet assembly 12.

The bore 14 may receive a patient table 16 for supporting a patient thereupon, the patient table 16 movable through the bore 14 during the examination process. The table 16 may include a termination box 18 at one end to which signals from local coils may be connected by means of connectors on the termination box 18 (not shown).

The termination box 18 communicates by means of shielded electrical cable 20 through a penetrator 22 in a shielded wall of the MRI room to an MRI processing unit 23, the latter which receives the NMR signals and reconstructs them into an image. Shielded electrical cable 20 may also carry transmit signals in the opposite direction, the transmit signals being an RF pulse transmitted to some local coils that provide transmitting as well as receiving capabilities as will be described below.

In the present invention, the table 16 may include a number of pockets 24 along its edges, the pockets 24 holding electrical connectors 26 communicating with optical cables 28 (as will be described further below) that may pass to the termination box 18 after conversion into electrical signals or that may pass through opening 22' in the shielded wall of the MRI room to a conversion unit 30 outside the MRI room that may convert the optical signals to electrical signals for use by the MRI processing unit 23. In both cases, the optical cables 28 pass through guideways within the table 16 to provide them with mechanical protection and to prevent them from tangling or interfering with access to a patient. The optical cables 28 may also be used outside of the table 16 for legacy MRI machines or the like.

An optically enabled local coil 34 will typically provide a form 36 that may be rigid or flexible, as is understood in the art, to fit about a portion of the patient. An electrical connector 32 is supported on the form 36, or attached to the local coil 34 by means of a short connecting lead (not shown), to receive signals from one or more loop antennas 38.

The electrical connectors 26 of the optical cables 28 may be attached to corresponding electrical connectors 32 to receive electrical NMR signals therefrom. Multiple local coils 34 may connect to different electrical connectors 26 or a single local coil 34 may have up to 128 multiple channels connecting to multiple electrical connectors 26. Generally the optical cables 28 have a smaller diameter and are more flexible and lower in weight than electrical counterparts.

Figure 3:
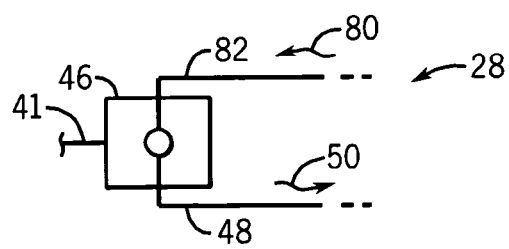
FIG. 3 is a detailed fragmentary view of a photomodulator operating to gate or intensity modulate a light signal received from the second end of the cable.

Referring now to FIG. 3, an example loop antenna 38 representing one channel on a local coil 34 may provide signals to a low noise preamplifier 40 contained within the local coil 34. The preamplifier receives electrical power through a power lead 43 and provides an output signal on output lead 41.

The local coil may further include active decoupling circuitry 42 that may receive an electrical signal on decoupling lead 44 to decouple the loop antenna 38 during a period when an RF excitation pulse will be received.

Each of leads 41, 43 and 44 join to electrical connector 32 which may be connected to electrical connectors 26 joined to a first end 45 of the optical cable 28.

Within a housing of the electrical connectors 26, or closely attached thereto, each of leads 41, 43 and 44 may connect to optical interface circuitry 55 providing a conversion between electrical signals and optical signals or vice versa.

Specifically, output lead 41 from the preamplifier 40 is received by a photomodulator 46 which, in a first embodiment, includes an impedance matching circuit 47 matching the output of the preamplifier 40 to the impedance of laser diode 49. The laser diode 49 converts the electrical signals from the preamplifier 40 into a modulated light signal 50 coupled to a standard optical fiber 48 contained within the optical cable 28. The laser diode 49 may be, for example, a constant light power in the absence of an NMR signal of approximately 10 milliwatts at a 1,550-nanometer wavelength that is linearly modulated in power to provide the required signal-to-noise ratio light signal 50. It will be understood to those of ordinary skill in the art that other frequencies and powers may be used as dictated by the transmission window of the optical fiber 48 and dynamic range and noise floor requirements.

The light signal 50 is propagated along the optical fiber 48 to a second end 51 of the optical cable 28 to be received by electrical interface circuitry 95 including a demodulator 52 which may be, for example, a photodiode 53 together with the necessary biasing and impedance matching circuitry 54 providing an output signal 56. The demodulator 52 may include filter elements, bias adjustments, and other well-known circuit features, and may be in the conversion unit 30 outside the MRI room, as described above, or may be in a housing of electrical connector 58, or closely attached thereto, at the second end of the optical cable 28. In the former case, the output signal 56 may proceed directly to the MRI processing unit 23 shown in FIG. 1. In the latter case, the output signals 56 may pass through the electrical connector 58 to be received by corresponding electrical connector 60 attached to the termination box 18 described above.

The electrical interface circuitry 95 at the second end 51 of the optical cable 28 may also include one or more laser diode light sources 62 and 64 coupled to optical fibers 66 and 68, respectively. Laser diode light sources 62 and 64 may deliver approximately one watt at 620 nanometers of wavelength. The low efficiency of current laser diode light sources cause them to dissipate as much as 10 watts per diode which may be removed from the circuitry (as is displaced from the patient) by heat sinks and/or air blowers. Piezoelectric nonmagnetic blowers may be used when the second end 51 of the cable 28 is in the magnetic field of the magnet assembly 12.

The optical fibers 66 and 68 carry optical power signals 70 that are received by photocells 72 and 74 at the first end 45 of the optical cable 28. The photocells 72 and 74 may be followed by power conditioning circuitry including DC-to-DC converter modules, filters and the like to provide a source of DC power to the local coil 34.

In one embodiment, DC power from photocell 72 may be received by the photomodulator 46 along lead 73 to provide for biasing current and the like, and by the low noise preamplifier 40 along lead 43 passing through electrical connectors 26 to electrical connector 32.

The electrical signal from photocell 74 may provide a decoupling signal on decoupling lead 44 to decoupling circuitry 42. Laser diode light source 64 thus will be activated to produce signal 78 when loop antenna 38 must be decoupled. Alternatively, laser light source 64 may be of lower power and may activate a photodiode (used directly as a decoupling circuit element) or to switch power from photocell 72 to the decoupling lead 44.

Figure 2:
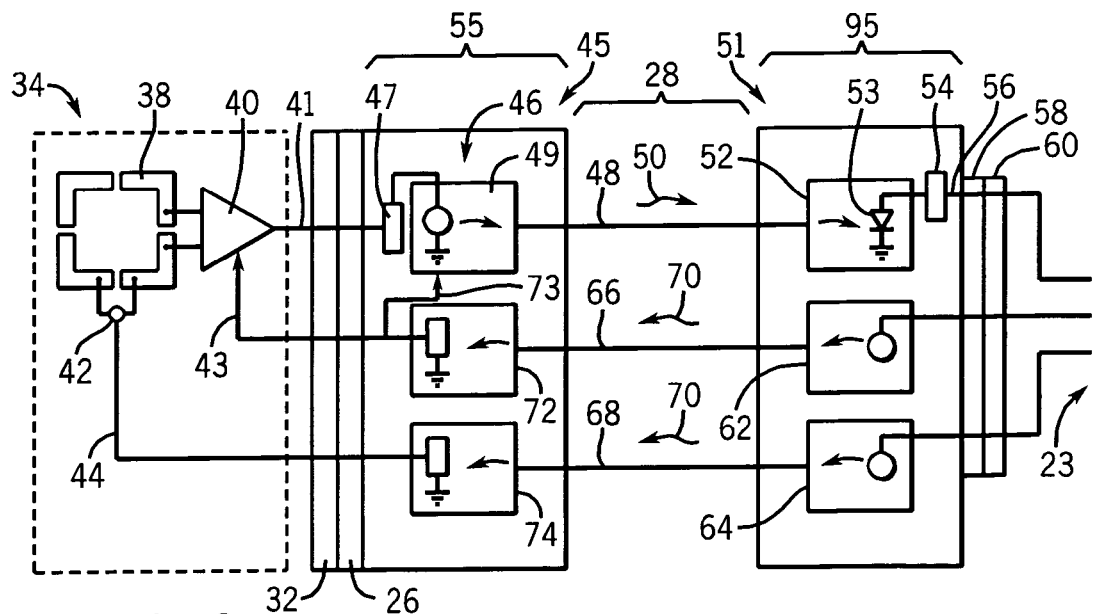
FIG. 2 is a schematic diagram of the optical cable of FIG. 1 showing use of an electrical connector to provide an electrical connection between the local coil and the optical cable through a photomodulator and photocells integrated into the optical cable.

In the embodiment of FIG. 2, the cable 28 is composed exclusively of optical fibers with no metallic conductors, and thus no electrical shielding is required. As a result, no shield currents are generated and no protection against heating of the patient is required.

Referring now to FIG. 3 in an alternative embodiment, the photomodulator 46' may be a Mach-Zehnder type photomodulator that does not require a source of electrical power, but receives light 80 along an additional optical fiber 82 and the NMR electrical signal on output lead 41 to modulate the intensity of the light 80 to produce modulated light signal 50 that is returned to the demodulator 52. The light 80 may be supplied by a laser diode light source (not shown) similar to laser diode light sources 62 and 64.

The embodiment of FIG. 3 may also eliminate metallic conductors in the cable 28 using the light power signals 70 as described above. Alternatively, it will be understood that some metallic conductors 86 may be employed together with optical fiber 48 (and possibly optical fiber 82) in lieu of optical fibers 66 and 68 in a embodiment where low frequency signals and power are conducted on copper conductors while the NMR signals is transmitted optically. In this embodiment, a shield may be required and shield currents must be suppressed by conventional methods such as baluns, chokes or high resistance cable. The benefit of low electrical interference with the NMR signal on optical fiber 48 and improved flexibility to the cable by eliminating some shielding and metallic conductors is still obtained.

Referring again to FIG. 2, while only a single loop antenna 38 (and hence single channel) is shown, the invention contemplates that multiple channels may be accommodated by a given cable 28 by adding additional optical fibers while still increasing the flexibility of the cable over an electrically conductive version.

Figure 4:
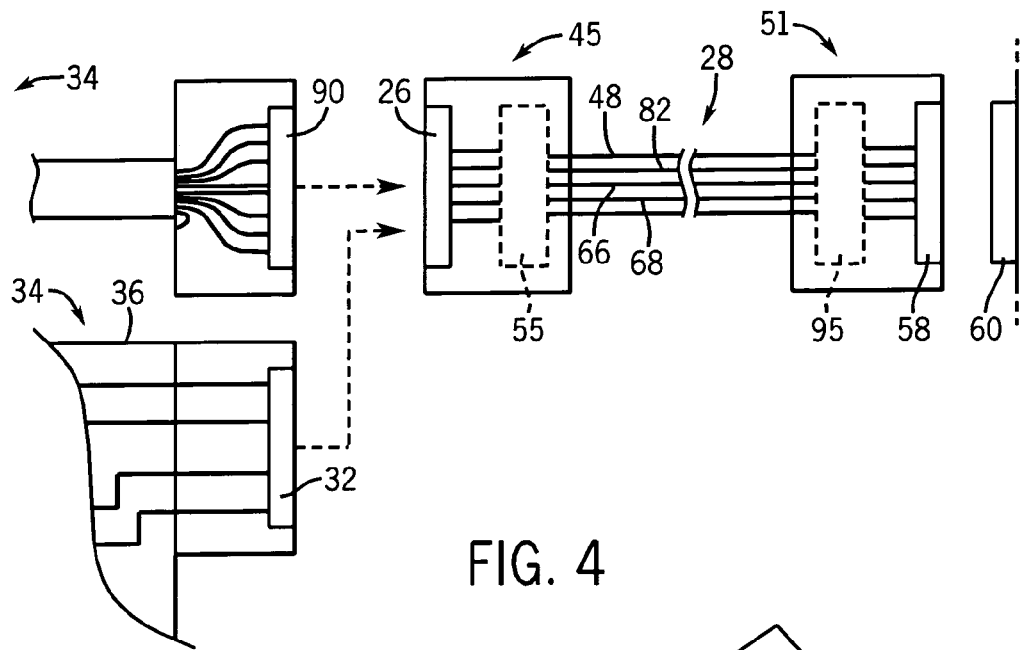
FIG. 4 is a mechanical diagram of a optical cable of FIG. 2 as may work with both optically enabled local coils or legacy local coils and which may be used to retrofit existing MRI machines to optically enabled local coils.

Referring now to FIG. 4, the electrical connectors 26 may be compatible with electrical connectors 90 standardly used on local coils that are not optically enabled as well as with electrical connectors 32 of the optically enabled local coil 34. In this way, the cables 28 may be used for both types of coils facilitating the migration of hospitals from one system to the other.

The optical interface circuitry 55 such as the photomodulator 46 and photocells 72 and 74 may be connected with fibers 48, 82, 66 and 68 of the cable 28 by factory-made permanent connections without the need for releasable connectors because the optical cable 28 can be disconnected from the local coil 34 at the interface between electrical connectors 26 and 90 or 26 and 32. Likewise at the second end 51 of the cable 26, the electrical interface circuitry 95 may be connected with fibers 48, 82, 66 and 68 of the cable 28 by factory made permanent connections without the need for releasable connectors either by permanent connection to the conversion unit 30 holding the electrical interface circuitry 95, or by the interface between electrical connectors 58 and 60. The use of the factory controlled termination without the need for releasable optical connectors provides substantial gains in signal-to-noise ratio.

While the electrical interface circuitry 95 may be connected directly to the MRI machine 10, when connectors 58 and 60 are used, they may be made mechanically identical to electrical connectors 32 and 26, respectively, to allow the system to work with existing MRI machines 10.

Figure 5:
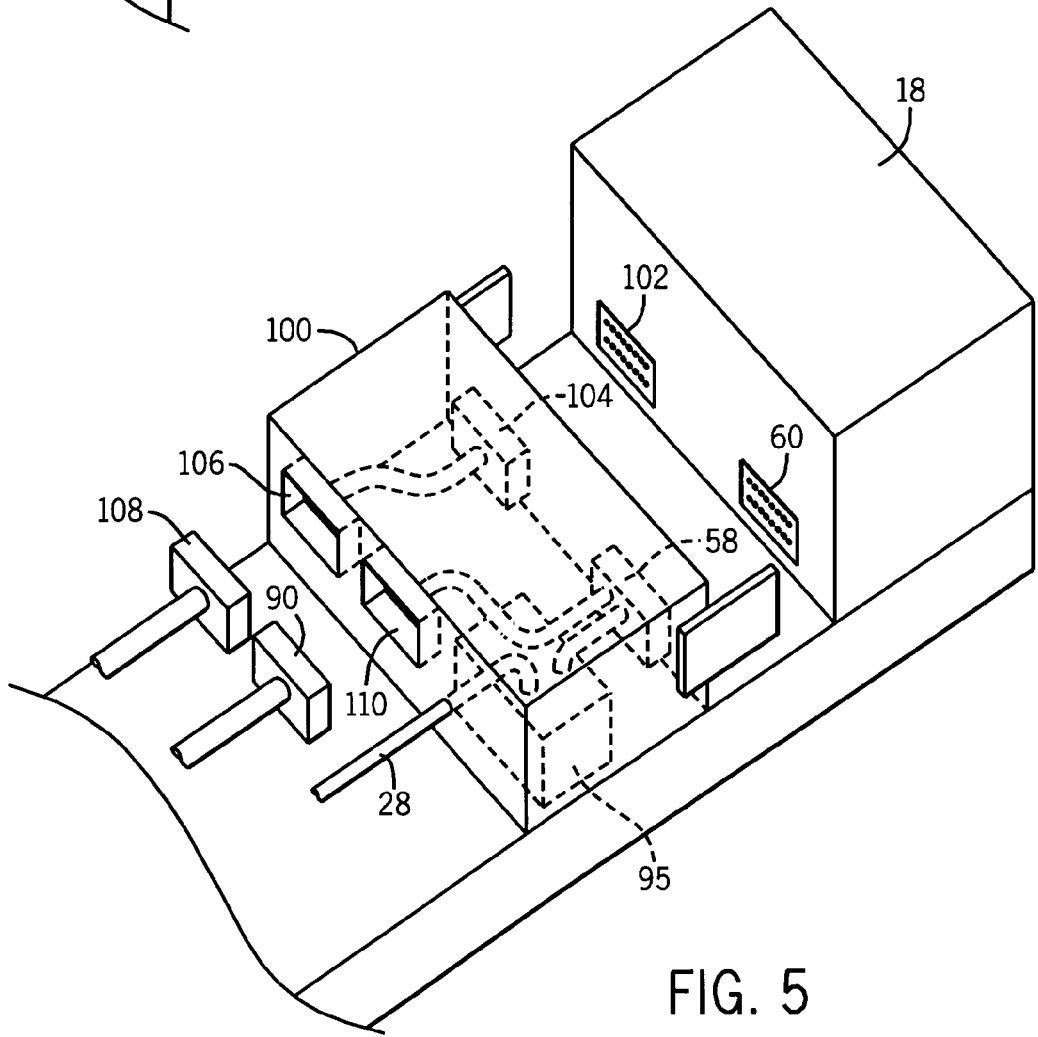
FIG. 5 is a perspective view in phantom of an adapter module that may attach to the termination box of an MRI machine to convert a standard MRI machine into use with optically enabled local coils.

Referring now to FIG. 5 in MRI machines 10 with a termination box 18, an adapter module 100 may be developed to facilitate transition of an MRI machine 10 to optical signal communication. The termination box 18 typically provides connector 60 for handling signals received for receive local coils 34 and a connector 102 providing signals output to transmit-type local coils 34. The adapter module 100 may therefore include a connector 104 connecting to connector 102 and providing a pass through to a connector 106 that may be received by connector 108 of the transmit coil.

Similarly, connector 60 may join to connector 58, as has been described, which may provide signals to the electrical interface circuitry 95 and then to cable 28. In parallel, connector 58 may connect to a pass-through connector 110 that may connect to connectors 90 of legacy coils or the like.

Importantly then, the present invention provides a migration path overcoming the compatibility problems that would otherwise occur in the transition from electrical to optical communication of the NMR signals.

It is specifically intended that the present invention not be limited to the embodiments and illustrations contained herein, but include modified forms of those embodiments including portions of the embodiments and combinations of elements of different embodiments as come within the scope of the following claims.

We claim:

1. A local coil system for MRI imaging comprising:
   a local coil freely movable with respect to a MRI machine and having:
   (i) a support structure positionable adjacent to a patient;
   (ii) at least one resonant electrical loop antenna attached to the support structure for receiving NMR electrical signals from the patient;
   (iii) a first electrical connector attached to the support structure and receiving the NMR electrical signals;
   (iv) a second electrical connector repeatedly and reversibly electrically and mechanically connectable to and disconnected from the first electrical connector to receive the NMR electrical signals therefrom, the second electrical connector having a photomodulator converting the NMR electrical signals to optical signals; and
   (v) an optical cable attached at a first end to the photomodulator to receive the optical signals; and
   (vi) a photo demodulator attached to a second end of the optical cable for receiving the optical signals and converting them back to NMR electrical signals for communication to an MRI machine.

2. The local coil system of claim 1 wherein the photomodulator is an electrically driven light source.

3. The local coil system of claim 1 wherein the photomodulator is an electrically driven light gate.

4. The local coil system of claim 1 wherein the optical cable is unbroken by connectors between the first and second end.

5. The local coil system of claim 1 further including a third electrical connector and wherein the photo demodulator communicates the NMR electrical signal to the MRI machine through the third connector and wherein the first and third connectors have substantially identical electrical and mechanical configurations.

6. The local coil system of claim 1 wherein the first connector corresponds to an electrical connector for receiving NMR signals on the MRI machine.

7. The local coil system of claim 1 wherein the optical cable is free from metallic electrical conductors.

8. The local coil system of claim 1 further including a light source providing an optical power signal attached to the second end of the optical cable and wherein the support structure includes at least one preamplifier positioned between the resonant electrical loop antenna and the first electrical connector, and wherein the second electrical connector further includes a photocell receiving the optical power sign from the optical cable, the photocell providing power to the preamplifier through the first electrical connector.

9. The local coil system of claim 1 further including a switchable light source providing an optical decoupling signal attached to the second end of the optical cable, and wherein the support structure includes at least one electrically actuated decoupling circuit decoupling the resonant electrical loop antenna from an excitation RF pulse, and wherein the second electrical connector further includes a photocell receiving the optical decoupling signal from the optical cable, the photocell providing power to the electrically actuated decoupling circuit.

10. The local coil system of claim 1 wherein the optical cable further includes metallic electrical conductors conducting electrical signals along the optical cable.

11. The local coil system of claim 10 wherein the metallic electrical conductors connect to the resonant electrical loop antenna to provide transmit signals to the resonant electrical loop antenna.

12. The local coil system of claim 10 wherein the metallic electrical conductors connect to the resonant electrical loop antenna to provide decoupling signals to the resonant electrical loop antenna.

13. The local coil system of claim 10 wherein the support structure includes at least one preamplifier positioned between the resonant electrical loop antenna and the first electrical connector wherein the metallic electrical conductors provide power to the preamplifier.

14. The local coil system of claim 1 wherein the support holds a plurality of resonant electrical loop antennas, and the first electrical connector has a corresponding plurality of photomodulator each associated with a separate optical channel on the optical cable.

15. A local coil system for MRI imaging comprising:
   a support structure positionable adjacent to a patient;
   at least one resonant electrical loop antenna attached to the support structure for receiving NMR electrical signals from the patient;
   a first electrical connector attach to the support structure and receiving the NMR electrical signals;
   a second electrical connector connectable to the first electrical connector to receive the NMR electrical signals therefrom, the second electrical connector having a photomodulator converting the NMR electrical signals to optical signals;
   an optical cable attached at a first end to the photomodulator to receive the optical signals; and
   a photo demodulator attached to a second end of the optical cable for receiving the optical signals and converting them back to NMR electrical signals for communication to an MRI machine, wherein the photomodulator is an electrically driven light source and further including a light source providing an optical power signal attached to the second end of the optical cable, and wherein the second electrical connector further includes a photocell receiving the optical power signal from the optical cable, the photocell providing power to the photomodulator.

16. An optical interface for MRI local coils comprising:
an optical cable containing at least one optical fiber having a first and second end without intervening connectors;
an electrical connector at the first end adapted to attach to a MRI local coil to receive electrical NMR signals therefrom, the electrical connector including a photomodulator receiving the electrical NMR signals and converting them to optical signals coupled to the first end of the optical cable;
a photodemodulator attached to the second end for receiving the optical signals and converting them to electrical signals for communication to the MRI machine; and
a second electrical connector, and wherein the photo demodulator communicates the NMR signal to the MRI machine through the second connector, and wherein the first and second connectors have substantially identical electrical and mechanical configurations.

17. The optical interface of claim 16 wherein the first connector corresponds to an electrical connector for receiving NMR signals on the MRI machine.

18. The optical interface of claim 16 wherein the optical cable is free from metallic conductors.

19. A kit comprising:
at least two MRI local coils providing a support structure positionable adjacent to a patient, at least one resonant electrical loop antenna attached to the support structure for receiving NMR electrical signals from the patient;
a first electrical connector attached to the support structure and receiving the NMR electrical signals;
an optical cable having a second electrical connector repeatedly and reversibly electrically and mechanically connectable to and disconnectable from the first electrical connectors of the MRI local coils to receive the NMR electrical signals therefrom, the second electrical connector further having a photomodulator converting the NMR electrical signals and converting them to optical signals, an optical cable attached at a first end to the photomodulator to receive the optical signals; and
a photo demodulator attached to a second end of the optical cable for receiving the optical signals and converting them back to NMR electrical signals for communication to an MRI machine.

20. An adapter for optically linked MRI local coils comprising:
an adapter base station having a first electrical connector attachable to a corresponding second connector on an MRI machine, the second connector intended for receiving electrical NMR signals from local coils, the adapter base station including a photo demodulator attached to a first end of an optical cable for receiving the optical signals and converting them to NMR electrical signals for communication to the MRI machine via the first and second connectors; and
a third electrical connector connectable to a fourth electrical connector on an optically enabled MRI coil to receive the NMR electrical signals therefrom, the third electrical connector further having a photomodulator converting the NMR electrical signals and converting them to optical signals on the optical cable.

21. The adapter of claim 20 wherein the adapter base station further includes a fifth electrical connector communicating directly with the second electrical connector for use with non-optically enabled MRI coils.

22. The adapter of claim 20 wherein the adapter base station further includes a sixth electrical connector communicating directly with a seventh electrical connector on the MRI machine, the seventh electrical connector intended for transmitting electrical RF excitation signals to local coils, the sixth electrical connector for use with transmit MRI local coils.

23. The adapter of claim 20 further including a light source providing an optical power signal attached to the second end of the optical cable and wherein the second electrical connector further includes a photocell receiving the optical power signal from the optical cable to provide electrical power to the MRI local coil.

* * * * *